US007823052B2

(12) United States Patent
Yu et al.

(10) Patent No.: US 7,823,052 B2
(45) Date of Patent: Oct. 26, 2010

(54) TRELLIS ENCODING DEVICE FOR ENCODING TRANSMISSION STREAM AND METHOD THEREOF

(75) Inventors: Jung-pil Yu, Suwon-si (KR); Yong-deok Chang, Suwon-si (KR); Eui-jun Park, Seoul (KR); Hae-joo Jeong, Seoul (KR); Yong-sik Kwon, Seoul (KR); Joon-soo Kim, Seoul (KR); Jin-Hee Jeong, Anyang-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1071 days.

(21) Appl. No.: 11/523,716

(22) Filed: Sep. 20, 2006

(65) Prior Publication Data

US 2007/0092034 A1    Apr. 26, 2007

Related U.S. Application Data

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005, provisional application No. 60/788,707, filed on Apr. 4, 2006.

(30) Foreign Application Priority Data

Jul. 20, 2006   (KR)   ............... 10-2006-0068055

(51) Int. Cl.
*H03M 13/00* (2006.01)
(52) U.S. Cl. .................. 714/784; 714/755; 714/786
(58) Field of Classification Search ................. 714/784, 714/755, 752, 792, 776, 786, 758, 782
See application file for complete search history.

(56) References Cited

U.S. PATENT DOCUMENTS

2003/0099303 A1 *  5/2003  Birru et al. ................. 375/265

(Continued)

FOREIGN PATENT DOCUMENTS

CN           1582580        2/2005

OTHER PUBLICATIONS

Written Opinion of the International Searching Authority mailed on Feb. 5, 2007, in International Application No. PCT/KR2006/004317.

(Continued)

*Primary Examiner*—Fritz Alphonse
(74) *Attorney, Agent, or Firm*—Sughrue Mion, PLLC (57) ABSTRACT

A trellis encoding device includes a trellis encoder block that includes a plurality of memories, and outputs a bit value determined by a state of the memories; a Reed-Solomon re-encoder that receives the bit value output from the trellis encoder block, and generates a parity corresponding to the bit value; and an adder that receives the parity generated by the Reed-Solomon re-encoder and a transmission stream including a parity, and corrects the parity of the transmission stream by adding the parity generated by the Reed-Solomon re-encoder to the transmission stream, thereby generating a parity-corrected transmission stream.

22 Claims, 4 Drawing Sheets

U.S. PATENT DOCUMENTS

2003/0103575 A1* 6/2003 Birru et al. .................. 375/265
2004/0028076 A1* 2/2004 Strolle et al. ................ 370/466

OTHER PUBLICATIONS

U.S. Appl. No. 11/416,254, filed May 3, 2006, Jung-pil Yu et al., Samsung Electronics Co., Ltd.
U.S. Appl. No. 11/416,258, filed May 3, 2006, Yong-sik Kwon et al., Samsung Electronics Co., Ltd.
U.S. Appl. No. 11/416,457, filed May 3, 2006, Jung-pil Yu et al., Samsung Electronics Co., Ltd.
U.S. Appl. No. 11/503,970, filed Aug. 15, 2006, Jung-pil Yu et al., Samsung Electronics Co., Ltd.
U.S. Appl. No. 11/504,024, filed Aug. 15, 2006, Jung-pil Yu et al., Samsung Electronics Co., Ltd.
U.S. Appl. No. 11/504,027, filed Aug. 15, 2006, Jung-pil Yu et al., Samsung Electronics Co., Ltd.
U.S. Appl. No. 11/504,029, filed Aug. 15, 2006, Jung-pil Yu et al., Samsung Electronics Co., Ltd.
U.S. Appl. No. 11/504,030, filed Aug. 15, 2006, Jung-pil Yu et al., Samsung Electronics Co., Ltd.
U.S. Appl. No. 11/504,031, filed Aug. 15, 2006, Jung-pil Yu et al., Samsung Electronics Co., Ltd.
U.S. Appl. No. 11/504,038, filed Aug. 15, 2006, Jung-pil Yu et al., Samsung Electronics Co., Ltd.
U.S. Appl. No. 11/504,651, filed Aug. 16, 2006, Jung-pil Yu et al., Samsung Electronics Co., Ltd.
U.S. Appl. No. 11/504,724, filed Aug. 16, 2006, Jung-pil Yu et al., Samsung Electronics Co., Ltd.
U.S. Appl. No. 11/504,725, filed Aug. 16, 2006, Jung-pil Yu et al., Samsung Electronics Co., Ltd.
U.S. Appl. No. 11/504,726, filed Aug. 16, 2006, Jung-pil Yu et al., Samsung Electronics Co., Ltd.
U.S. Appl. No. 11/505,369, filed Aug. 17, 2006, Jung-pil Yu et al., Samsung Electronics Co., Ltd.
U.S. Appl. No. 11/505,894, filed Aug. 18, 2006, Eui-jun Park et al., Samsung Electronics Co., Ltd.
U.S. Appl. No. 11/508,144, filed Aug. 23, 2006, Jung-pil Yu et al., Samsung Electronics Co., Ltd.
U.S. Appl. No. 11/692,509, filed Mar. 28, 2007, Hae-joo Jeong et al., Samsung Electronics Co., Ltd.
Office Action issued in corresponding Chinese Patent Application No. 200680037502.5 dated Apr. 10, 2009.

* cited by examiner

TRELLIS ENCODING DEVICE FOR ENCODING TRANSMISSION STREAM AND METHOD THEREOF

CROSS-REFERENCE TO RELATED APPLICATIONS

This application claims the benefit of U.S. Provisional Patent Applications No. 60/728,777 filed on Oct. 21, 2005, No. 60/734,295 filed on Nov. 8, 2005, No. 60/738,050 filed on Nov. 21, 2005, No. 60/739,448 filed on Nov. 25, 2005, and No. 60/788,707 filed on Apr. 4, 2006, in the United States Patent and Trademark Office, and Korean Patent Application No. 2006-68055 filed on Jul. 20, 2006, in the Korean Intellectual Property Office. The disclosures of these six priority applications are incorporated herein by reference in their entirety.

BACKGROUND OF THE INVENTION

1. Field of the Invention

An aspect of the invention generally relates to a trellis encoding device for trellis-encoding a transmission stream for digital broadcasting and a method thereof. More particularly, an aspect of the invention relates to a trellis encoding device and method in a transmission system for generating and transmitting a transmission stream into which a supplementary reference signal is inserted for trellis-encoding the transmission stream and correcting parity errors caused by initializing memories of a trellis encoder block to a known state before trellis-encoding the supplementary reference signal in the transmission system to improve a reception performance of an Advanced Television Systems Committee (ATSC) Vestigial VSB Digital Television (DTV) system that is an American-type digital terrestrial broadcasting system.

2. Description of the Related Art

An ATSC VSB DTV system that is an American-type digital terrestrial broadcasting system is a single-carrier system, and provides a field sync for each unit of 312 data segments. Accordingly, this system exhibits poor reception performance over an inferior channel, particularly over a Doppler fading channel.

Figure 1:
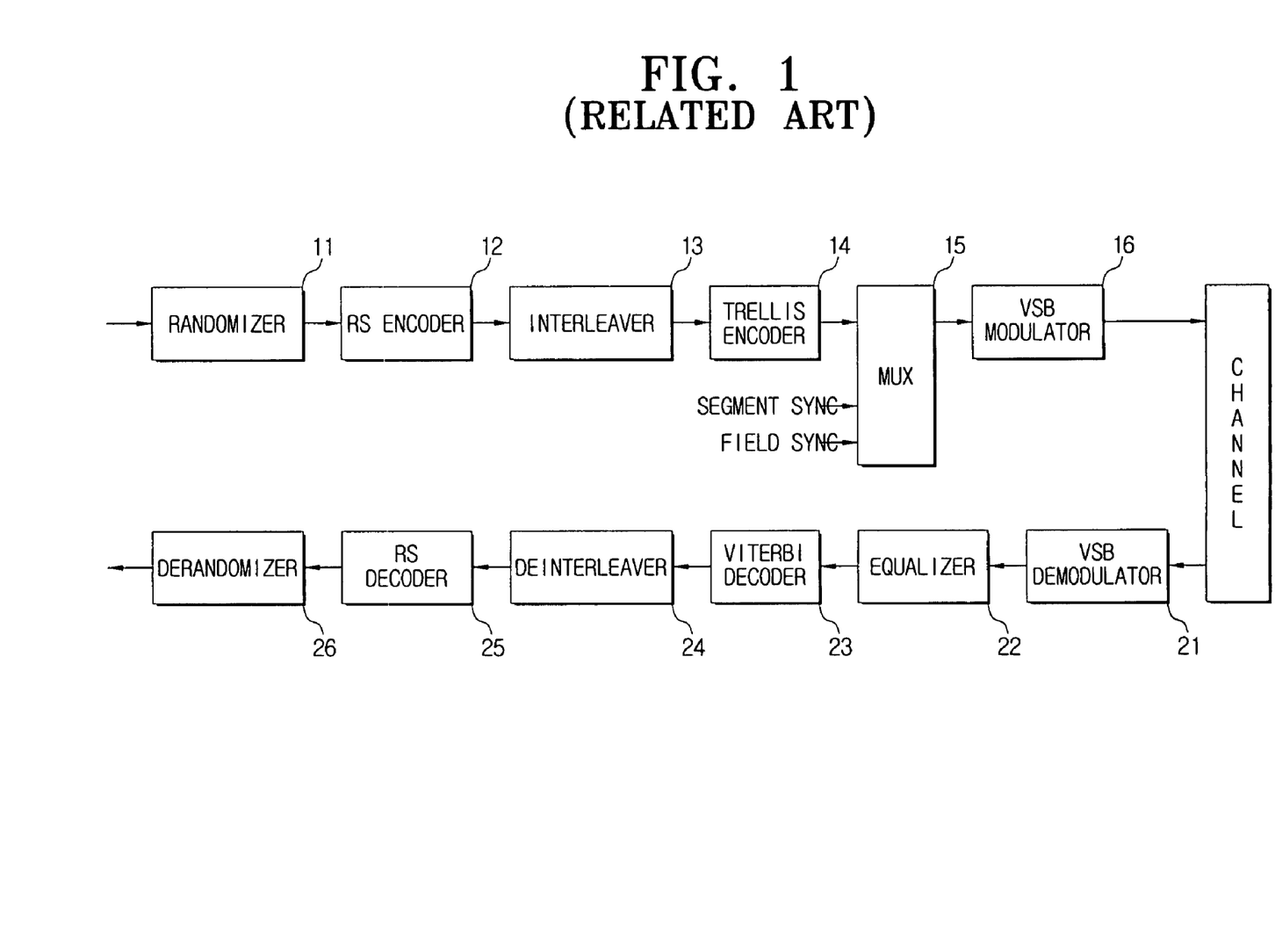
FIG. 1 is a block diagram of an example of a conventional ATSC VSB DTV digital broadcasting system including a digital broadcasting transmitter and a digital broadcasting receiver.

FIG. 1 is a block diagram of an example of a transmitter and a receiver of an American-type digital terrestrial broadcasting system complying with an ATSC Enhanced VSB (EVSB) DTV standard that has been proposed by Philips Electronics. This system generates and transmits a dual transmission stream by adding a robust stream to a normal stream of the conventional ATSC VSB system. A robust stream is a stream that has been subjected to a robust data process to provide improved reception performance compared to a normal stream over an inferior channel, particularly over a Doppler fading channel. The current version of this standard is ATSC Digital Television Standard A/53, Revision E, dated Dec. 27, 2005, with Amendment No. 1, dated Apr. 18, 2006, and can be downloaded from www.atsc.org. This standard is referred to hereafter as ATSC Standard A/53E. The contents of this standard are incorporated herein by reference in their entirety.

As shown in FIG. 1, the digital broadcasting transmitter includes a randomizer 11 randomizing a dual transmission stream, a Reed-Solomon (RS) encoder 12 which is a concatenated coder adding parity bytes to the dual transmission stream to correct errors occurring due to channel characteristics during transmission, an interleaver 13 interleaving the RS-encoded data according to a specified interleaving pattern, and a ⅔ rate trellis encoder 14 mapping the interleaved data into 8-level symbols by performing a ⅔ rate trellis-encoding of the interleaved data. The dual transmission stream received by the randomizer 11 is an MPEG-2 transmission stream, and thus the digital broadcasting transmitter of FIG. 1 performs an error correction coding of the MPEG-2 transmission stream. The digital broadcasting transmitter of FIG. 1 is an 8-VSB system because the trellis encoder 14 maps the interleaved data into 8-level data symbols.

Figure 2:
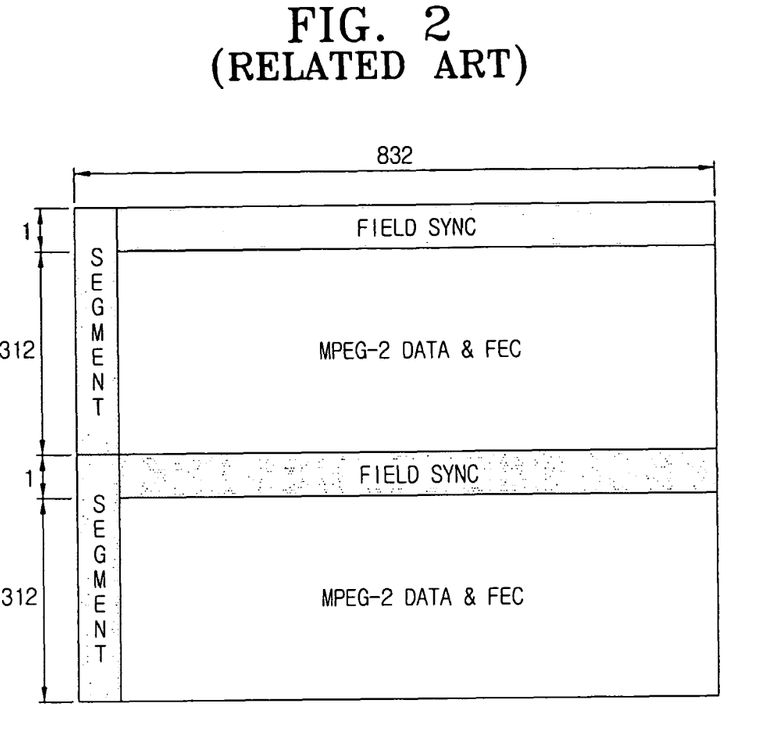
FIG. 2 is a diagram of a conventional ATSC VSB DTV data frame.

The digital broadcasting transmitter of FIG. 1 further includes a multiplexer (MUX) 15 multiplexing a field sync signal and a segment sync signal with the data symbols from the trellis encoder 14 to obtain an ATSC VSB DTV data frame having the configuration shown in FIG. 2, and a VSB modulator 16 inserting a pilot into the data symbols that have been multiplexed with the field sync signal and the segment sync signal by adding a specified DC value to the data symbols, performing a VSB modulation of the data symbols by pulse-shaping the data symbols to obtain a VSB-modulated signal, and up-converting the VSB-modulated signal to an RF channel band signal which is then transmitted over a channel.

Accordingly, in the digital broadcasting transmitter of FIG. 1, a multiplexer (not shown) multiplexes the normal stream and the robust stream to obtain a dual transmission stream to be transmitted over one channel, and inputs the dual transmission stream to the randomizer 11. The input data is randomized by the randomizer 11, the randomized data is outer-coded by the RS encoder 12 serving as an outer coder, and the outer-coded data is interleaved by the interleaver 13 according to a specified interleaving pattern. The interleaved data is inner-coded in units of 12 symbols and mapped into 8-level symbols by the trellis encoder 14. A field sync signal and a segment sync signal are multiplexed with the data symbols from the trellis encoder 14 by the multiplexer 15. A pilot is inserted in the data symbols that have been multiplexed with the field sync signal and the segment sync signal by the multiplexer 15, the data symbols with the inserted pilot are VSB-modulated by the VSB modulator 16 to obtain a VSB-modulated signal, and the VSB-modulated signal is up-converted to an RF channel band signal which is then transmitted over the channel.

The digital broadcasting receiver of FIG. 1 includes a tuner (not shown) down-converting the RF channel band signal received through the channel to a baseband signal, a VSB demodulator 21 performing sync detection and demodulation on the baseband signal, an equalizer 22 compensating the demodulated signal for channel distortions such as multipath, a Viterbi decoder 23 correcting errors in the equalized signal to obtain data symbols and decoding the data symbols to obtain decoded data, a deinterleaver 24 deinterleaving the decoded data according to the specified interleaving pattern used by the interleaver 13 of the digital broadcasting transmitter, a RS decoder 25 correcting errors in the decoded data, and a derandomizer 26 derandomizing the error-corrected data from the RS decoder 25 and outputting an MPEG-2 dual transmission stream.

Hence, the digital broadcasting receiver of FIG. 1 recovers the original signal inputted to the randomizer 11 of the digital broadcasting transmitter of FIG. 1 by reversing the operations performed by the digital broadcasting transmitter of FIG. 1 by down-converting the RF channel band signal to the baseband signal, demodulating and equalizing the baseband signal, and performing a channel decoding operation on the baseband signal.

FIG. 2 shows an ATSC VSB DTV data frame having the field sync signal and the segment sync signal that is used in the American-type digital terrestrial broadcasting system. As shown in FIG. 2, one frame consists of two fields, and one field consists of one field sync segment as the first segment, and 312 data segments. In the ATSC VSB DTV data frame, one data segment corresponds to one MPEG-2 packet, and consists of a 4-symbol segment sync signal and 828 data symbols.

The segment sync signal and the field sync signal shown in FIG. 2 are used for synchronization and equalization in the VSB demodulator 21 and the equalizer 22 in the digital broadcasting receiver of FIG. 1. That is, the field sync signal and the segment sync signal are known data known to both the digital broadcasting transmitter and the digital broadcasting receiver of FIG. 1, which is used as a reference signal for the equalization performed by the equalizer 220 in the digital broadcasting receiver of FIG. 1.

As discussed above, the digital terrestrial broadcasting system of FIG. 1 generates and transmits a dual transmission stream by multiplexing the robust stream with the normal stream of the conventional ATSC VSB DTV system so that the robust stream is transmitted together with the conventional normal stream.

However, the digital terrestrial broadcasting system of FIG. 1 cannot enhance the poor reception performance of the conventional normal stream over a multipath channel even when the dual transmission stream with the multiplexed robust stream is transmitted. That is, the reception performance for the normal stream is not enhanced at all even when the dual transmission stream is transmitted. In addition, the reception performance for the turbo stream over the multipath channel does not show any great improvement.

A technique of inserting a supplementary reference signal into the dual transmission stream to enhance the reception performance of the turbo stream is under development. Accordingly, a technique of properly encoding the dual transmission stream having the inserted supplementary reference signal is required.

SUMMARY OF THE INVENTION

An aspect of the invention is to solve the above-mentioned and/or other problems and disadvantages providing a trellis encoding device and method in a transmission system for generating and transmitting a transmission stream into which a supplementary reference signal is inserted for trellis-encoding the transmission stream and correcting parity errors caused by initializing memories of a trellis encoder block to a known state before trellis-encoding the supplementary reference signal to improve a reception performance of the ATSC VSB DTV system that is an American-type digital terrestrial broadcasting system.

According to an aspect of the invention, a trellis encoding device includes a trellis encoder block that includes a plurality of memories, and outputs a bit value determined by a state of the memories; a Reed-Solomon re-encoder that receives the bit value output from the trellis encoder block, and generates a parity corresponding to the bit value; and an adder that receives the parity generated by the Reed-Solomon re-encoder and a transmission stream including a parity, corrects the parity of the transmission stream by adding the parity generated by the Reed-Solomon re-encoder to the transmission stream, thereby generating a parity-corrected transmission stream.

According to an aspect of the invention, the trellis encoding device may further include a multiplexer that receives the parity-corrected transmission stream generated by the adder, and outputs the parity-corrected transmission stream to the trellis encoder block; wherein the trellis encoder block trellis-encodes the parity-corrected transmission stream output from the multiplexer, thereby generating a trellis-encoded transmission stream.

According to an aspect of the invention, the trellis encoding device may further include a map that receives the trellis-encoded transmission stream generated by the trellis encoder block, maps the trellis-encoded transmission stream into data symbols, and outputs the data symbols.

According to an aspect of the invention, the trellis encoder block may include a plurality of trellis encoders that output trellis-encoded data; a splitter that receives the parity-corrected transmission stream and outputs the parity-corrected transmission stream to the trellis encoders in sequence; and a de-splitter that sequentially outputs the trellis-encoded data output by the trellis encoders.

According to an aspect of the invention, each of the trellis encoders may include a first memory that outputs a value stored in the first memory as a first part of the bit value, the first memory being one of the memories of the trellis encoder block; a second memory that outputs a value stored in the second memory as a second part of the bit value, the second memory being one of the memories of the trellis encoder block; and a third memory that outputs a value stored in the third memory to the second memory, the third memory being one of the memories of the trellis encoder block.

According to an aspect of the invention, the bit value output from the trellis encoder block may be a combination of the first part of the bit value output from the first memory and the second part of the bit value output from the second memory; and the Reed-Solomon re-encoder may generate the parity corresponding to the bit value based on the combination of the first part of the bit value and the second part of the bit value.

According to an aspect of the invention, the transmission stream may be a transmission stream including a supplementary reference signal and a normal stream, and may be a dual transmission stream further including a turbo stream.

According to an aspect of the invention, the parity-corrected transmission stream may include the supplementary reference signal; the trellis encoders may trellis-encode the supplementary reference signal in the parity-corrected transmission stream; and the trellis encoders may trellis-encode the bit value to initialize the first memory, the second memory, and the third memory to a known state immediately before trellis-encoding the supplementary reference signal.

According to an aspect of the invention, there is provided a trellis encoding method for trellis-encoding a transmission stream with a trellis encoder, the trellis encoder comprising a plurality of memories, the transmission stream comprising a parity, the trellis encoding method including generating a bit value determined by a state of the memories of the trellis encoder; generating a parity corresponding to the bit value; and correcting the parity of the transmission stream by adding the parity corresponding to the bit value to the transmission stream, thereby generating a parity-corrected transmission stream.

According to an aspect of the invention, the trellis encoding method may further include inputting the parity-corrected transmission stream to the trellis encoder; trellis-encoding the parity-corrected transmission stream with the trellis encoder to generate a trellis-encoded transmission stream; mapping the trellis-encoded transmission stream into data symbols; and outputting the data symbols.

According to an aspect of the invention, the memories of the trellis encoder may include a first memory that outputs a value stored in the first memory as a first part of the bit value; a second memory that outputs a value stored in the memory as a second part of the bit value; and a third memory that outputs a value stored in the third memory to the second memory; and the generating of the bit value may include combining the first part of the bit value output from the first memory and the second part of the bit value output from the second memory to generate the bit value.

According to an aspect of the invention, the transmission stream may be a transmission stream including a supplementary reference signal and a normal stream, and may be a dual transmission stream further including a turbo stream.

According to an aspect of the invention, the parity-corrected transmission stream may include the supplementary reference signal; and the trellis encoding method may further include inputting the parity-corrected transmission stream to the trellis encoder; trellis-encoding the parity-corrected transmission stream with the trellis encoder; inputting the bit value to the trellis encoder in place of the parity-corrected transmission stream immediately before trellis-encoding the supplementary reference signal in the parity-corrected transmission stream; trellis-encoding the bit value with the trellis encoder to initialize the first memory, the second memory, and the third memory to a known state; inputting the parity-corrected transmission stream to the trellis encoder in place of the bit value when the first memory, the second memory, and the third memory have been initialized to the known state; and trellis-encoding the supplementary reference signal in the parity-corrected transmission signal with the trellis encoder.

Additional aspects and/or advantages of the invention will be set forth in part in the description that follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the embodiments of the invention, examples of which are shown in the accompanying drawings, wherein like reference numerals refer to like elements throughout. The embodiments are described below in order to explain the invention by referring to the figures.

Figure 3:
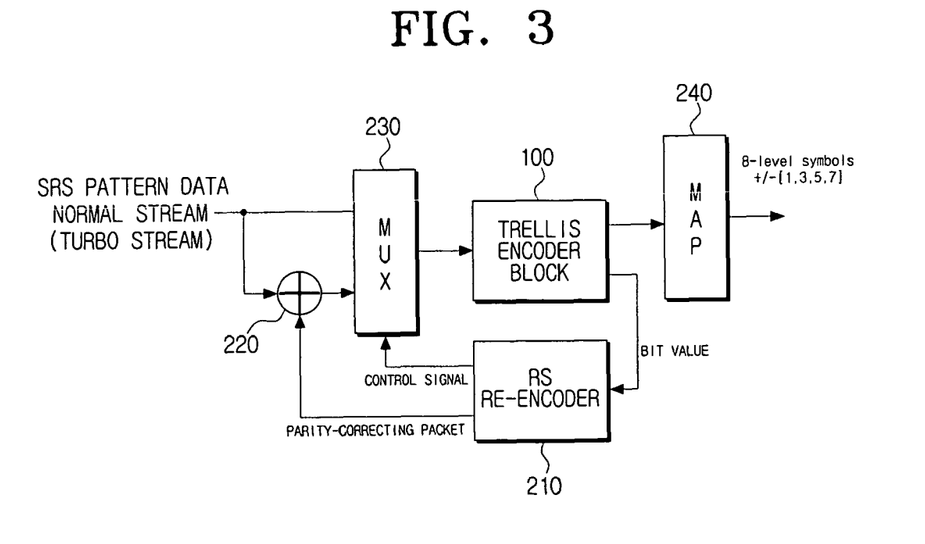
FIG. 3 is a block diagram of an example of a trellis encoding device according to an aspect of the invention.

FIG. 3 is a block diagram of an example of a trellis encoding device according to an aspect of the invention. The trellis encoding device of FIG. 3 is applicable to a digital broadcasting transmission system. In more detail, the trellis encoding device can be used in a digital broadcasting transmission system that reconstructs and transmits a dual transmission stream after extracting only a turbo stream from the dual transmission stream including a normal stream and the turbo stream and performing a turbo processing on the turbo stream. The turbo processing is a robust data process using a turbo coding process to provide improved reception performance for the turbo stream compared to the normal stream over an inferior channel, particularly over a Doppler fading channel. The trellis encoding device of FIG. 3 according to an aspect of the invention can be used to trellis-encode the reconstructed dual transmission stream in such a system.

The trellis encoding device of FIG. 3 includes a trellis encoder block 100, a Reed-Solomon (RS) re-encoder 210, an adder 220, a multiplexer (MUX) 230, and a map 240. The adder 220 performs an exclusive-OR operation.

The multiplexer 230 can operate in either in a normal operation mode in which a packet of an incoming transmission stream is trellis-encoded, or a parity-correction operation mode in which a parity-corrected packet received from the adder 220 is trellis-encoded. The operation mode of the multiplexer 230 is determined by a control signal that is received from the RS re-encoder 210.

In the normal operation mode, the multiplexer 230 transmits the incoming transmission stream to the trellis encoder block 100. In contrast, in the parity correction operation mode, the multiplexer 230 transmits the parity-corrected packet received from the adder 220 to the trellis encoder block 100.

The trellis encoder block 100 trellis-encodes a packet in the stream received from the multiplexer 230, and outputs the trellis-encoded packet as trellis-encoded data symbols. The packet in the stream received from the multiplexer 230 contains supplementary reference signal (SRS) pattern data according to an aspect of the invention. The SRS is a known signal pattern that is known to both a digital broadcasting transmitter and a digital broadcasting receiver according to an aspect of the invention. The digital broadcasting receiver can easily check the characteristics of the channel over which the digital broadcasting receiver receives a signal including the SRS from the digital broadcasting transmitter by comparing the signal pattern of the SRS in the received signal with the known signal pattern of the SRS. Based on a result of the comparison, the digital broadcasting receiver adjusts an equalizer to compensate for distortions caused by the channel characteristics. Such an equalizer according to an aspect of the invention is similar to the equalizer 22 in FIG. 1 of the related art. However, the equalizer 22 performs equalization based on the field sync signal that appears only once every 312 data segments or packets, and thus cannot adapt to the rapidly changing channel characteristics of an inferior channel, particularly a Doppler fading channel. In contrast, the equalizer according to an aspect of the invention can perform equalization based both on the field sync signal that appears only once every 312 data segments or packets and on the SRS that appears in every one of the 312 data segments or packets in a field, thereby enabling the equalizer according to an aspect of the invention to adapt to the rapidly changing channel characteristics of an inferior channel, particularly a Doppler fading channel, thereby improving reception performance of an ATSC VSB DTV system modified according to an aspect of the invention.

In order for the equalizer according to an aspect of the invention to perform the channel equalization described above, the SRS must have the same pattern every time it is transmitted over the channel. The SRS has the same pattern in each packet in the stream received from the multiplexer 230.

However, the trellis encoder block 100 includes memories that the trellis encoder block 100 uses in performing a trellis-encoding operation on each packet in the stream received from the multiplexer 230, and the trellis-encoded data symbol output by the trellis encoder block 100 when a given unit of input data is trellis-encoded may be different depending on a state of the memories at the time the given unit of input data is trellis-encoded. As a result, the SRS transmitted over the channel may have a different pattern depending on the state of the memories at a time the SRS pattern data was trellis-encoded by the trellis encoder block 100. This problem can be avoided by initializing the memories of the trellis encoder block 100 to a known state immediately before the trellis encoder block 100 begins encoding the SRS pattern data. The SRS pattern data can be inserted in a specified area of each packet of the transmission stream so that it can be known with certainty when the SRS pattern data will arrive at the trellis encoder block 100 to be encoded, and thus it can be known with certainty when to initialize the memories of the trellis encoder block 100 to the known state. The process of initializing the memories of the trellis encoder block 100 to a known state at a known time according to an aspect of the invention is called a deterministic trellis reset (DTR).

As will be described in detail below in connection with FIG. 5, the memories of the trellis encoder block 100 are initialized to the known state by trellis-encoding a bit value determined by a state of the memories in place of data in the packet in the stream received from the multiplexer 230 during an initialization operation that takes place over two trellis-encoding operation periods. A trellis-encoding operation period is a period of time during which the trellis encoder block 100 trellis-encodes one unit of input data and outputs one trellis-encoded data symbol. The data in the packet in the stream received from the multiplexer 230 that arrives during these two trellis-encoding operation periods is discarded. Thus, the packet that is actually trellis-encoded is different from the packet in the stream received from the multiplexer 230. However, the packet in the stream received from the multiplexer 230 includes a parity that was generated based in part on the discarded data, such that the parity is incorrect with respect to the bit values that were trellis-encoded in place of the discarded data. Accordingly, the trellis encoder block 100 outputs these bit values to the RS re-encoder 210, and the RS re-encoder 210 generates, for each of the bit values, a bit value packet in which all bits are "0" except for bit value bits which may be "1" or "0" and are located at the positions of the discarded data, generates a parity for the bit value packet, appends the parity to the bit value packet to generate a parity-correcting packet, and outputs the parity-correcting packet to the adder 220.

The adder 220 adds the parity-correcting packet generated by the RS re-encoder 210 to the original packet in the incoming transmission stream received by the multiplexer 230 by performing an exclusive OR operation to generate a parity-corrected packet, and outputs the parity-corrected packet to the multiplexer 230. The incoming transmission stream may be a transmission stream including SRS pattern data and a normal stream, or may be a dual transmission stream including SRS pattern data, a normal stream, and a turbo stream. The addition performed by the adder 220 is performed as follows:

(A) omitted . . . 10100101011<u>00</u>1010101011AAAAA . . . omitted (B) omitted . . . 000000000000<u>01</u>0000000000BBBBB . . . omitted (C) omitted . . . 10100101011<u>01</u>1010101011CCCCC . . . omitted (A) is an example of the original packet in the incoming transmission stream received by the multiplexer 230, (B) is an example of the parity-correcting packet generated by the RS re-encoder 210, and (C) is an example of the parity-corrected packet generated by the adder 220 as a result of the exclusive OR operation performed on the original packet (A) and the parity-correcting packet (B) by the adder 220. When the memories of the trellis block encoder 100 are to be initialized, the underlined bits "00" in the original packet (A) are discarded and a bit value "01" corresponding to the underlined bits "01" in the parity-correcting packet (B) is encoded by the trellis encoder block 100 in place of the discarded bits "00." The bit value "01" is determined by a state of the memories of the trellis block encoder 100 at a time when the memories of the trellis encoder block 100 are to be initialized, and is output from the trellis encoder block 100 to the RS re-encoder 210, which generates the parity-correcting packet (B) as described above. The parity "BBBBB" of the parity-correcting packet (B) generated by the RS re-encoder 210 is a parity corresponding to the bit value "01" that is underlined in the parity-correcting packet (B).

The adder 220 generates the parity-corrected packet (C) by performing an exclusive OR operation on the original packet (A) and the parity-correcting packet (B). As can be seen from the parity-corrected packet (C), the underlined bits "00" in the original packet (A) are changed to the underlined bits "01" in the parity-corrected packet C, and the parity "AAAAA" in the original packet (A) is changed to the parity "CCCCC" in the parity-corrected packet (C).

The control signal output from the RS re-encoder 210 to the multiplexer 230 controls the multiplexer 230 to operate in the normal operation mode in which the multiplexer 230 transmits the original packet (A) in the incoming transmission stream to the trellis encoder block 100 until parity "AAAAA" in the original packet (A) arrives at the multiplexer 230. At that time, the control signal output from the RS re-encoder 210 to the multiplexer 230 controls the multiplexer 230 to switch to the parity-correcting operation mode in which the multiplexer 230 transmits the parity-corrected packet (C) received from the adder 220 to the trellis encoder block 100 until the last bit of the parity "CCCCC" of the parity-corrected packet (C) has been transmitted to the trellis encoder block 100. At that time, the control signal output from the RS re-encoder 210 to the multiplexer 230 controls the multiplexer 230 to switch back to the normal operation mode.

The map 240 maps the trellis-encoded data symbols output from the trellis encoder block 100 into 8-level data symbols, and outputs the 8-level data symbols. More specifically, the map 240 can map the trellis-encoded data symbols output from the trellis encoder block 100 into 8-level data symbols in accordance with the following Table 1.

TABLE 1

| Z2 | Z1 | Z0 | R |
| --- | --- | --- | --- |
| 0 | 0 | 0 | −7 |
| 0 | 0 | 1 | −5 |
| 0 | 1 | 0 | −3 |
| 0 | 1 | 1 | −1 |
| 1 | 0 | 0 | +1 |
| 1 | 0 | 1 | +3 |
| 1 | 1 | 0 | +5 |
| 1 | 1 | 1 | +7 |

In Table 1, $Z2$, $Z1$, $Z0$ denote a trellis-encoded data symbol output from the trellis encoder block 100 and input to the map 240, and R denotes a corresponding 8-level data symbol output from the map 240. For instance, when the trellis-encoded value Z2, Z1, Z0 output from the trellis encoder block 100 and input to the map 240 is 0, 0, 0, the map 240 outputs an 8-level data symbol of −7.

Figure 4:
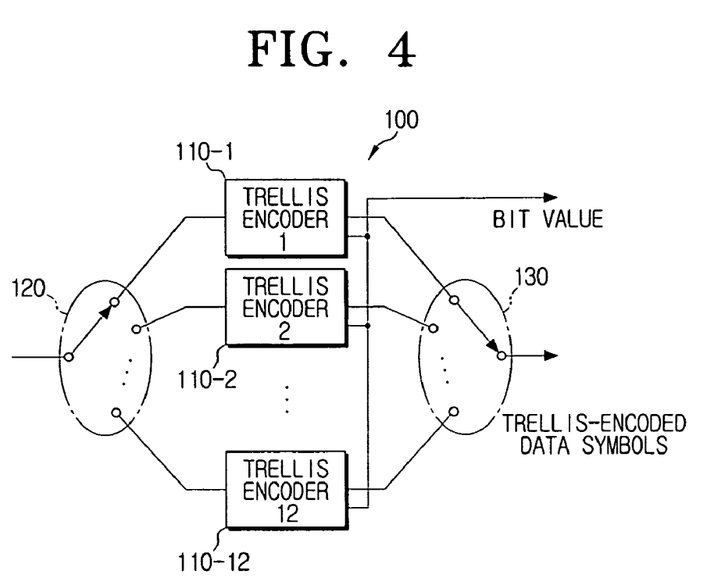
FIG. 4 is a block diagram of an example of the trellis encoder block 100 of the trellis encoding device of FIG. 3 according to an aspect of the invention.

FIG. 4 is a block diagram of an example of the trellis encoder block 100 of the trellis encoding device of FIG. 3 according to an aspect of the invention. Referring to FIG. 4, the trellis encoder block 100 includes twelve trellis encoders 110-1 through 110-12, a splitter 120, and a de-splitter 130.

The splitter 120 outputs the stream received from the multiplexer 230 to the trellis encoders 110-1 through 110-12 in sequence in byte units. That is, the splitter 120 outputs one byte of the stream received from the multiplexer 230 to the trellis encoder 110-1, then outputs the next byte of the stream received from the multiplexer 230 to the trellis encoder 110-2, and so forth, until after twelve bytes, the splitter 120 again outputs one byte of the stream received from the multiplexer 230 to the trellis encoder 110-1.

During a normal operation, the trellis encoders 110-1 through 110-12 trellis-encode the stream received from the multiplexer 230. The stream output from the splitter 120 contains 8-bit bytes of input data. Each of the trellis encoders 110-1 through 110-12 trellis-encodes one 8-byte of input data from the stream output from the splitter 120 as four 2-bit words, and successively outputs one 3-bit trellis-encoded data symbol for each of these four 2-bit words, with a 12-symbol delay between each of the 3-bit trellis-encoded data symbols, thereby outputting four 3-bit trellis-encoded data symbols for each byte of input data. The trellis-encoding of one 2-bit word and the outputting of one 3-bit trellis-encoded data symbol takes place in one trellis-encoding operation period. Each of the trellis encoders 110-1 through 110-12 includes a plurality of memories used in performing the trellis-encoding operation. As described above, these memories are initialized to a known state during an initialization operation that takes place over two trellis-encoding operation periods. During the initialization operation, a bit value determined by a state of the memories in one of the trellis encoders 110-1 through 110-12 in which the initialization operation is currently being performed is encoded by the one of the trellis encoders 110-1 through 110-12 during two trellis-encoding operation periods to initialize the memories to a known state immediately before trellis-encoding SRS pattern data in the stream output from the splitter 120, and the bit value is output to the RS re-encoder 210 of FIG. 3. As described above in connection with FIG. 3, the RS re-encoder 210 generates a parity-correcting packet based on the bit value and outputs the parity-correcting packet to the adder 220.

The de-splitter 130 sequentially outputs the trellis-encoded data symbols output from the trellis encoders 110-1 through 110-12 to the map 240 of FIG. 3 at 1-symbol intervals. That is, the de-splitter 130 outputs one trellis-encoded data symbol from the trellis encoder 110-1, then after a 1-symbol interval outputs one trellis-encoded data symbol from the trellis encoder 110-2, and so forth, until after a 12-symbol interval since the de-splitter last output one trellis-encoded data symbol from the trellis encoder 110-1, the de-splitter 130 again outputs one trellis-encoded data symbol from the trellis encoder 110-1. The operation of the splitter 120 and the de-splitter 130 of the trellis encoder block 100 are the same as the operation of the splitter and the de-splitter of the trellis encoder described in Section 5.4.1.4 of Annex D of ATSC Standard A/53E referred to above, and thus will not be described in detail here.

As discussed above, each of the trellis encoders 110-1 through 110-12 includes a plurality of memories used in performing the trellis-encoding operation, and the memories are initialized to a known state immediately before trellis-encoding SRS pattern data by trellis-encoding a bit value determined by a state of the memories during an initialization operation that takes place over two trellis-encoding operation periods, and the bit value is output to the RS re-encoder 210.

Figure 5:
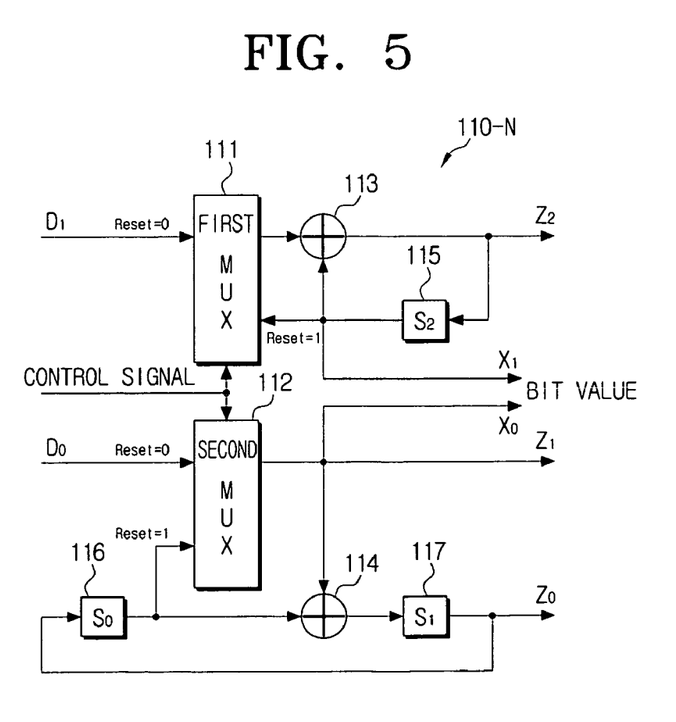
FIG. 5 is a block diagram of an example of a trellis encoder 110-N according to an aspect of the invention that can be used for each of the trellis encoders 110-1 to 110-12 of FIG. 4.

FIG. 5 is a block diagram of an example of a trellis encoder 110-N according to an aspect of the invention that can be used for each of the trellis encoders 110-1 to 110-12 of FIG. 4. The trellis encoder 110-N is a modification of the trellis encoder shown in FIG. D5.8 of Annex D of ATSC Standard A/53E referred to above in which a first multiplexer (MUX) 111, a second multiplexer (MUX) 112, a control signal input, and a bit value (X0 X1) output have been added. A first memory 115 receives a trellis-encoded data symbol bit Z2 output from a first adder 113, and outputs a value S2 to the multiplexer 111 and the first adder 113, and also outputs the value S2 to the RS re-encoder 210 of FIG. 3 as a bit value bit X1. A second memory 116 receives a trellis-encoded data symbol bit Z0 output from a third memory 117, and outputs a value S0 to the second multiplexer 112 and to a second adder 114. The third memory 117 receives a value output from the second adder 114, and outputs a value S1 as the trellis-encoded data symbol bit Z0 to the second memory 116 and to the de-splitter 130 of FIG. 4. The first adder 113 receives a value output from the first multiplexer 111 and the value S2 output from the first memory 115, and outputs the trellis-encoded data symbol bit Z2 to the first memory 115 and to the de-splitter 130 of FIG. 4. The second adder 114 receives a trellis-encoded data symbol bit Z1 output from the second multiplexer 112 and the value S0 output from the second memory 116, and outputs a value to the third memory 117. The first multiplexer 111 receives an input data byte bit D1 from the splitter 120 of FIG. 4, the value S2 output from the first memory 115, and the control signal, and outputs a value to the first adder 113. The second multiplexer 112 receives an input data byte bit D0 from the splitter 120 of FIG. 4, the value S0 output from the second memory 116, and the control signal, and outputs the trellis-encoded data symbol bit Z1 to the second adder 114, and also outputs the trellis-encoded data symbol bit Z1 to the RS re-encoder 210 of FIG. 3 as a bit value bit X0. The bit value bit X0 and the bit value bit X1 constitute the bit value (X0 X1). The first memory 115, the second memory 116, and the third memory 117 each provide a 12-data-symbol delay.

During a normal trellis-encoding operation as indicated by "Reset=0" in FIG. 5, the control signal controls the first multiplexer 111 to output the input data byte bit D1 received from the splitter 120 of FIG. 4 to the first adder 113, and controls the second multiplexer 112 to output the input data byte bit D0 received from the splitter 120 of FIG. 4 as the trellis-encoded data symbol bit Z1. Thus, during the normal trellis-encoding operation, the trellis encoder 110-N trellis-encodes the input data byte bits (D0 D1).

In contrast, during an initialization operation in which the states of the first memory 115, the second memory 116, and the third memory 117 are initialized to a known state as indicated by "Reset=1" in FIG. 5, the control signal controls the first multiplexer 111 to output the value S2 received from the first memory 115 which is also the bit value bit X1 to the first adder 113, and controls the second multiplexer 112 to output the value S0 received from the second memory 116 as the trellis-encoded data symbol bit Z1 which is also the bit value bit X0. The control signal controls the first multiplexer 111 and the second multiplexer 112 in this manner over two trellis-encoding operation periods. Thus, during the initialization operation, the trellis encoder 110-N trellis-encodes the bit value (X0 X1) over two trellis-encoding operation periods.

Since the second memory 116 and the third memory 117 are connected in series and thus carry out a shift operation, two trellis-encoding operation periods are required to initialize both the second memory 116 and the third memory 117 to a known state in the initialization operation. The first memory 115, the second memory 116, and the third memory 117 can be in any one of eight initial value states (000, 111, 001, 010, 100, 110, 101, 011) at the beginning of the initialization operation. However, regardless of the initial value state, the state of the first memory 115, the second memory 116, and the third memory 117 can be initialized to a known state of 000 by encoding the bit value (X0 X1) over two trellis-encoding operation periods as shown in the following Table 2. The known state of 000 is a zero state, i.e., a state in which the states in the first memory 115, the second memory 116, and the third memory 117 are all zero. In Table 2, a "Reset" value of "1" indicates the initialization operation, "t=0" indicates a beginning of the first trellis-encoding operation period of the initialization operation, "t=1" indicates a beginning of the second trellis-encoding operation period of the initialization operation, and "t=2" indicates a beginning of a first trellis-encoding operation period of a normal trellis-encoding operation after the initialization operation.

TABLE 2

| Reset at t = 0 | (S0 S1 S2) at t = 0 | (X0 X1) at t = 0 | (S0 S1 S2) at t = 1 | (X0 X1) at t = 1 | (S0 S1 S2) Next State at t = 2 | (Z2 Z1 Z0) Output |
|---|---|---|---|---|---|---|
| 1 | 000 | 00 | 000 | 00 | 000 | 000 |
| 1 | 001 | 01 | 000 | 00 | 000 | 000 |
| 1 | 010 | 00 | 100 | 10 | 000 | 000 |
| 1 | 011 | 01 | 100 | 10 | 000 | 000 |
| 1 | 100 | 10 | 000 | 00 | 000 | 000 |
| 1 | 101 | 11 | 000 | 00 | 000 | 000 |
| 1 | 110 | 10 | 100 | 10 | 000 | 000 |
| 1 | 111 | 11 | 100 | 10 | 000 | 000 |

The above Table 2 is based on the fact that there are two memories connected in series in the trellis encoder 110-N of FIG. 5, i.e., the second memory 116 and the third memory 117. However, if a trellis encoder having three, four, five, etc., memories connected in series is used as the trellis encoder 110-N, then a bit value must be encoded by such a trellis encoder during an initialization period that takes place over three, four, five, etc., trellis-encoding operation periods in order to initialize the memories of such a trellis encoder to a known state.

Figure 6:
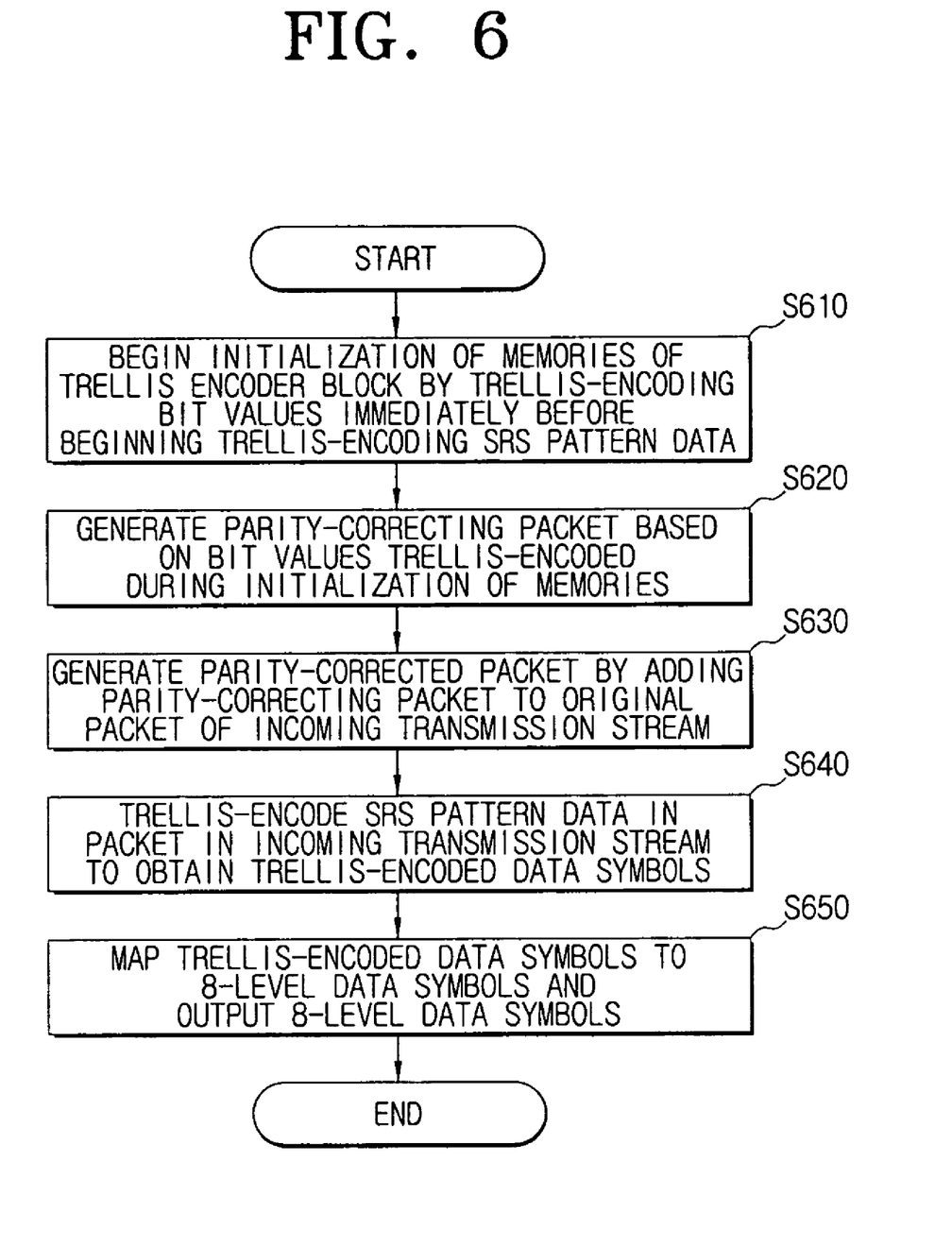
FIG. 6 is a flowchart of an example of a trellis encoding method according to an aspect of the invention.

FIG. 6 is a flowchart of an example of a trellis encoding method according to an aspect of the invention. Referring to FIG. 5, initialization of the memories of the trellis encoder block 100 is begun by trellis-encoding bit values immediately before beginning trellis-encoding SRS pattern data (block S610). A parity-correcting packet is generated based on bit values trellis-encoded during the initialization of the memories (block S620). A parity-corrected packet is generated by adding the parity-correcting packet to an original packet in an incoming transmission stream (block S630). The incoming transmission stream may be a transmission stream including SRS pattern data and a normal stream, or may be a dual transmission stream including SRS pattern data, a normal stream, and a turbo stream. SRS pattern data in a packet in the incoming transmission stream is trellis-encoded to obtain trellis-encoded data symbols (block S640). The trellis-encoded data symbols are mapped to 8-level data symbols and the 8-level data symbols are output (block S650). The mapping of the trellis-encoded data symbols to the 8-level data symbols can be performed based on Table 1.

Subsequently, the transmission stream in the form of the 8-level data symbols is subjected to multiplexing with a field sync signal and a segment sync signal, pilot insertion, VSB modulation, an up-conversion to an RF channel band signal which is then transmitted. These subsequent processing operations are the same as the processing operations performed by the multiplexer 15 and the VSB modulator 16 of FIG. 1, and thus will not be described in detail here.

As set forth above, a trellis encoding device according to an aspect of the invention in a transmission system for generating and transmitting a transmission stream into which a supplementary reference signal is inserted can improve a reception performance of an ATSC VSB DTV system that is an American-type digital terrestrial broadcasting system by trellis-encoding the transmission stream and correcting parity errors caused by initializing memories of a trellis encoder block to a known state before trellis-encoding the supplementary reference signal. Therefore, it is possible to successfully process and transmit the transmission stream into which the supplementary reference signal is inserted.

Although several embodiments of the invention have been shown and described, it would be appreciated by those skilled in the art that changes may be made in these embodiments without departing from the principles and spirit of the invention, the scope of which is defined in the claims and their equivalents.

What is claimed is:

1. A trellis encoding device comprising:
    a trellis encoder block that comprises a plurality of memories, and outputs a bit value determined by a state of the memories;
    a Reed-Solomon re-encoder that receives the bit value output from the trellis encoder block, and generates a parity corresponding to the bit value; and
    an adder that receives the parity generated by the Reed-Solomon re-encoder and a transmission stream comprising a parity, and corrects the parity of the transmission stream by adding the parity generated by the Reed-Solomon re-encoder to the transmission stream, thereby generating a parity-corrected transmission stream.

2. The trellis encoding device of claim 1, further comprising a multiplexer that receives the parity-corrected transmission stream generated by the adder, and outputs the parity-corrected transmission stream to the trellis encoder block;
    wherein the trellis encoder block trellis-encodes the parity-corrected transmission stream output from the multiplexer, thereby generating a trellis-encoded transmission stream.

3. The trellis encoding device of claim 2, further comprising a map that receives the trellis-encoded transmission stream generated by the trellis encoder block, maps the trellis-encoded transmission stream into data symbols, and outputs the data symbols.

4. The trellis encoding device of claim 3, wherein the data symbols are 8-level data symbols.

5. The trellis encoding device of claim 1, wherein the trellis encoder block comprises:
    a plurality of trellis encoders that output trellis-encoded data;
    a splitter that receives the parity-corrected transmission stream and outputs the parity-corrected transmission stream to the trellis encoders in sequence; and
    a de-splitter that sequentially outputs the trellis-encoded data output by the trellis encoders.

6. The trellis encoding device of claim 5, wherein each of the trellis encoders comprises:

a first memory that outputs a value stored in the first memory as a first part of the bit value, the first memory being one of the memories of the trellis encoder block;

a second memory that outputs a value stored in the second memory as a second part of the bit value, the second memory being one of the memories of the trellis encoder block; and a third memory that outputs a value stored in the third memory to the second memory, the third memory being one of the memories of the trellis encoder block.

7. The trellis encoding device of claim 6, wherein the bit value output from the trellis encoder block is a combination of the first part of the bit value output from the first memory and the second part of the bit value output from the second memory; and wherein the Reed-Solomon re-encoder generates the parity corresponding to the bit value based on the combination of the first part of the bit value and the second part of the bit value.

8. The trellis encoding device of claim 6, wherein the transmission stream received by the adder is a transmission stream comprising known data and a normal stream.

9. The trellis encoding device of claim 8, wherein the transmission stream received by the adder is a dual transmission stream further comprising a turbo stream.

10. The trellis encoding device of claim 8, wherein the known data has a known pattern used to perform channel equalization in a receiver that receives the transmission stream.

11. The trellis encoding device of claim 8, wherein the parity-corrected transmission stream comprises the known data;

wherein the trellis encoders trellis-encode the known data in the parity-corrected transmission stream; and wherein the trellis encoders trellis-encode the bit value to initialize the first memory, the second memory, and the third memory to a known state immediately before trellis-encoding the known data.

12. The trellis encoding device of claim 1, wherein the trellis encoder block uses the memories in performing a trellis encoding operation.

13. The trellis encoding device of claim 1, wherein the trellis encoder block trellis-encodes the bit value to initialize the memories to a zero state.

14. The trellis encoding device of claim 1, wherein the adder adds the parity generated by the Reed-Solomon re-encoder to the parity of the transmission stream, thereby generating the parity-corrected transmission stream.

15. The trellis encoding device of claim 1, wherein the Reed-Solomon re-encoder outputs a control signal indicating whether an initialization operation for initializing the memories to a known state is to be performed;

wherein the trellis encoding device further comprises a multiplexer that receives the transmission stream received by the adder, the parity-corrected transmission stream from the adder, and the control signal from the Reed-Solomon re-encoder, and outputs a transmission stream to be encoded to the trellis encoder block;

wherein the multiplexer outputs the transmission stream to the trellis encoder block as the transmission stream to be encoded when the control signal indicates that the initialization operation is not to be performed, and outputs the parity-corrected transmission stream to the trellis encoder block as the transmission stream to be encoded when the control signal indicates that the initialization operation is to be performed; and wherein the trellis encoder block encodes the transmission stream to be encoded output from the multiplexer.

16. A trellis encoding method for trellis-encoding a transmission stream with a trellis encoder, the trellis encoder comprising a plurality of memories, the transmission stream comprising a parity, the trellis encoding method comprising:

generating a bit value determined by a state of the memories of the trellis encoder;

generating a parity corresponding to the bit value; and correcting the parity of the transmission stream by adding the parity corresponding to the bit value to the transmission stream, thereby generating a parity-corrected transmission stream.

17. The trellis encoding method of claim 16, further comprising:

inputting the parity-corrected transmission stream to the trellis encoder;

trellis-encoding the parity-corrected transmission stream with the trellis encoder to generate a trellis-encoded transmission stream;

mapping the trellis-encoded transmission stream into data symbols; and outputting the data symbols.

18. The trellis encoding method of claim 16, wherein the memories of the trellis encoder comprise:

a first memory that outputs a value stored in the first memory as a first part of the bit value;

a second memory that outputs a value stored in the second memory as a second part of the bit value; and a third memory that outputs a value stored in the third memory to the second memory; and wherein the generating of the bit value comprises combining the first part of the bit value output from the first memory and the second part of the bit value output from the second memory to generate the bit value.

19. The trellis encoding method of claim 18, wherein the transmission stream is a transmission stream comprising known data and a normal stream.

20. The trellis encoding method of claim 19, wherein the transmission stream is a dual transmission stream further comprising a turbo stream.

21. The trellis encoding method of claim 19, wherein the known data has a known pattern used to perform channel equalization in a receiver that receives the transmission stream.

22. The trellis encoding method of claim 18, wherein the parity-corrected transmission stream comprises the known data; and wherein the trellis encoding method further comprises:

inputting the parity-corrected transmission stream to the trellis encoder;

trellis-encoding the parity-corrected transmission stream with the trellis encoder;

inputting the bit value to the trellis encoder in place of the parity-corrected transmission stream immediately before trellis-encoding the known data in the parity-corrected transmission stream;

trellis-encoding the bit value with the trellis encoder to initialize the first memory, the second memory, and the third memory to a known state;

inputting the parity-corrected transmission stream to the trellis encoder in place of the bit value when the first memory, the second memory, and the third memory have been initialized to the known state; and trellis-encoding the known data in the parity-corrected transmission stream with the trellis encoder.

* * * * *